(12) United States Patent
Barnette

(10) Patent No.: US 8,957,514 B1
(45) Date of Patent: Feb. 17, 2015

(54) OPERATING AND MANUFACTURING A DC-DC CONVERTER

(71) Applicant: International Business Machines Corporation, Armonk, NY (US)

(72) Inventor: Jamaica L. Barnette, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/061,242

(22) Filed: Oct. 23, 2013

Related U.S. Application Data

(63) Continuation of application No. 14/050,007, filed on Oct. 9, 2013.

(51) Int. Cl.
*H01L 23/538* (2006.01)
*H02M 3/155* (2006.01)
*H01L 49/02* (2006.01)

(52) U.S. Cl.
CPC .............. *H02M 3/155* (2013.01); *H01L 28/10* (2013.01); *H01L 23/538* (2013.01); *H02M 2003/1552* (2013.01)
USPC ......................................................... 257/691

(58) Field of Classification Search
CPC ....... H01L 23/538; H01L 28/10; H02M 3/155
USPC ................... 257/531, 533, 691, 724, 686
See application file for complete search history.

(56) References Cited

U.S. PATENT DOCUMENTS

| | | | |
|---|---|---|---|
| 3,969,752 A | 7/1976 | Martin et al. | |
| 4,193,083 A | 3/1980 | Max | |

(Continued)

FOREIGN PATENT DOCUMENTS

| | | |
|---|---|---|
| GB | 2484010 A | 3/2012 |
| JP | 02012-060854 A | 3/2012 |

(Continued)

OTHER PUBLICATIONS

Zhou et al.; "Exploration of On-Chip Switched-Capacitor DC-DC Converter for Multicore Processors Using a Distributed Power Delivery Network", Custom Integrated Circuits Conference (CICC), Sep. 2011, pp. 1-4, IEEE.org (online), doi: 10.1109/CICC.2011.6055333, URL: http://ieeexplore.ieee.org/stamp/stamp.jsp?tp=&arnumber=6055333&isnumber=6055276.

(Continued)

*Primary Examiner* — Nathan Ha
(74) *Attorney, Agent, or Firm* — Edward J. Lenart; Katherine S. Brown; Biggers Kennedy Lenart Spraggins LLP

(57) ABSTRACT

Manufacturing a DC-DC converter on a chip includes: providing a die having a p-type top side and an n-type bottom side; removing an interior portion, creating a hole; flipping the interior portion; inserting the interior portion into the hole; fabricating high-side switch cells in the interior portion's top side and low-side switch cells in the exterior portion's top side; sputtering a magnetic material on the entire top side; burrowing tunnels into the magnetic material; and applying conductive material on the magnetic material and within the tunnels, electrically coupling pairs of high-side and low-side switches, with each pair forming a micro-power-switching phase, where the conductive material forms an output node of the phase, and the conductive material in the burrowed tunnels forms, in each phase, a torodial inductor with a single loop coil and, for the plurality of phases, a directly coupled inductor.

9 Claims, 11 Drawing Sheets

Identity Switching DC-DC Converter 300

(56) References Cited

U.S. PATENT DOCUMENTS

| | | |
|---|---|---|
| 4,232,254 A | 11/1980 | Haferl |
| 4,447,866 A | 5/1984 | Reeves |
| 4,720,667 A | 1/1988 | Lee et al. |
| 4,720,668 A | 1/1988 | Lee et al. |
| 4,785,387 A | 11/1988 | Lee et al. |
| 4,841,220 A | 6/1989 | Tabisz et al. |
| 4,851,769 A | 7/1989 | Carpenter et al. |
| 4,857,822 A | 8/1989 | Tabisz et al. |
| 4,860,184 A | 8/1989 | Tabisz et al. |
| 4,866,367 A | 9/1989 | Ridley et al. |
| 4,866,525 A | 9/1989 | Rodriguez-Cavazos et al. |
| 4,931,716 A | 6/1990 | Jovanovic et al. |
| 4,961,048 A | 10/1990 | Banura |
| 5,063,488 A | 11/1991 | Harada et al. |
| 5,068,776 A | 11/1991 | Polivka |
| 5,122,728 A | 6/1992 | Ashley |
| 5,204,809 A | 4/1993 | Andresen |
| 5,262,930 A | 11/1993 | Hua et al. |
| 5,325,283 A | 6/1994 | Farrington et al. |
| 5,329,439 A | 7/1994 | Borojevic et al. |
| 5,373,432 A | 12/1994 | Vollin et al. |
| 5,418,702 A | 5/1995 | Marinus et al. |
| 5,418,704 A | 5/1995 | Hua et al. |
| 5,432,695 A | 7/1995 | Vlatkovic et al. |
| 5,442,540 A | 8/1995 | Hua et al. |
| 5,477,858 A | 12/1995 | Norris et al. |
| 5,479,087 A | 12/1995 | Wright |
| 5,486,752 A | 1/1996 | Hua et al. |
| 5,530,396 A | 6/1996 | Vlatkovic et al. |
| 5,574,636 A | 11/1996 | Lee et al. |
| 5,633,793 A | 5/1997 | Lee et al. |
| 5,694,302 A | 12/1997 | Faulk |
| 5,793,272 A | 8/1998 | Burghartz et al. |
| 5,914,572 A | 6/1999 | Qian et al. |
| 5,920,471 A | 7/1999 | Rajagopalan et al. |
| 5,949,199 A | 9/1999 | Qian et al. |
| 6,018,468 A | 1/2000 | Archer et al. |
| 6,057,652 A | 5/2000 | Chen et al. |
| 6,114,937 A | 9/2000 | Burghartz et al. |
| 6,147,882 A | 11/2000 | Huber et al. |
| 6,268,093 B1 | 7/2001 | Kenan et al. |
| 6,330,170 B1 | 12/2001 | Wang et al. |
| 6,337,801 B2 | 1/2002 | Li et al. |
| 6,349,044 B1 | 2/2002 | Canales-Abarca et al. |
| 6,362,986 B1 | 3/2002 | Schultz et al. |
| 6,414,469 B1 | 7/2002 | Zhou et al. |
| 6,426,666 B1 | 7/2002 | Li et al. |
| 6,437,999 B1 | 8/2002 | Wittenbreder |
| 6,442,033 B1 | 8/2002 | Liu et al. |
| 6,452,815 B1 | 9/2002 | Zhu et al. |
| 6,466,459 B1 | 10/2002 | Guerrera |
| 6,480,086 B1 | 11/2002 | Kluge et al. |
| 6,531,740 B2 | 3/2003 | Bosco et al. |
| 6,545,450 B1 | 4/2003 | Ledenev et al. |
| 6,552,565 B2 | 4/2003 | Chang et al. |
| 6,587,356 B2 | 7/2003 | Zhu et al. |
| 6,590,791 B1 | 7/2003 | Zhou et al. |
| 6,636,430 B1 | 10/2003 | Batarseh et al. |
| 6,650,217 B1 | 11/2003 | Wolf et al. |
| 6,696,803 B2 | 2/2004 | Tao et al. |
| 6,696,823 B2 | 2/2004 | Ledenev et al. |
| 6,710,639 B2 | 3/2004 | Huang et al. |
| 6,737,842 B2 | 5/2004 | Bai et al. |
| 6,757,184 B2 | 6/2004 | Wei et al. |
| 6,781,853 B2 | 8/2004 | Xu et al. |
| 6,784,644 B2 | 8/2004 | Xu et al. |
| 6,800,985 B2 | 10/2004 | Baker et al. |
| 6,815,937 B2 | 11/2004 | Poon et al. |
| 6,819,574 B2 | 11/2004 | Xu et al. |
| 6,834,002 B2 | 12/2004 | Yang |
| 6,859,372 B2 | 2/2005 | Xu et al. |
| 6,876,556 B2 | 4/2005 | Zhu et al. |
| 6,933,541 B1 | 8/2005 | Huang |
| 6,944,033 B1 | 9/2005 | Xu et al. |
| 6,952,335 B2 | 10/2005 | Huang et al. |
| 6,989,997 B2 | 1/2006 | Xu et al. |
| 7,016,203 B2 | 3/2006 | Xu et al. |
| 7,046,527 B2 | 5/2006 | West |
| 7,071,660 B2 | 7/2006 | Xu et al. |
| 7,109,838 B2 | 9/2006 | Brennan et al. |
| 7,161,335 B2 | 1/2007 | Wei et al. |
| 7,180,389 B2 | 2/2007 | Wang et al. |
| 7,184,281 B2 | 2/2007 | Ren et al. |
| 7,196,914 B2 | 3/2007 | Ren et al. |
| 7,199,695 B1 | 4/2007 | Zhou et al. |
| 7,233,132 B1 | 6/2007 | Dong et al. |
| 7,254,047 B2 | 8/2007 | Ren et al. |
| 7,265,525 B2 | 9/2007 | Xu et al. |
| 7,317,305 B1 | 1/2008 | Stratakos et al. |
| 7,391,165 B2 | 6/2008 | Lee et al. |
| 7,447,924 B2 | 11/2008 | May |
| 7,528,625 B2 | 5/2009 | Ozasa et al. |
| 7,531,407 B2 | 5/2009 | Clevenger et al. |
| 7,545,208 B2 | 6/2009 | Rodriguez |
| 7,548,137 B2 | 6/2009 | Wang et al. |
| 7,554,423 B2 | 6/2009 | Wang et al. |
| 7,560,833 B2 * | 7/2009 | Strzalkowski et al. ....... 307/113 |
| 7,560,912 B2 | 7/2009 | Xu et al. |
| 7,569,875 B2 * | 8/2009 | Suzuki et al. ................. 257/287 |
| 7,570,037 B2 | 8/2009 | Li et al. |
| 7,583,065 B2 | 9/2009 | Xu et al. |
| 7,602,154 B2 | 10/2009 | Fu et al. |
| 7,602,159 B2 | 10/2009 | Wang et al. |
| 7,605,572 B2 | 10/2009 | Xu et al. |
| 7,613,020 B2 | 11/2009 | Nukisato et al. |
| 7,638,988 B2 | 12/2009 | Lim et al. |
| 7,649,434 B2 | 1/2010 | Xu et al. |
| 7,705,577 B2 | 4/2010 | Li et al. |
| 7,742,318 B2 | 6/2010 | Fu et al. |
| 7,746,041 B2 | 6/2010 | Xu et al. |
| 7,746,675 B2 | 6/2010 | Wang et al. |
| 7,791,321 B2 | 9/2010 | Xu et al. |
| 7,800,922 B2 | 9/2010 | Takayanagi et al. |
| 7,804,281 B2 | 9/2010 | Wang et al. |
| 7,821,375 B2 | 10/2010 | Dong et al. |
| 7,859,238 B1 | 12/2010 | Stratakos et al. |
| 7,872,886 B2 | 1/2011 | Xu et al. |
| 7,893,669 B2 | 2/2011 | Osterhout et al. |
| 7,932,800 B2 | 4/2011 | Lim et al. |
| 7,965,165 B2 | 6/2011 | Ikriannikov et al. |
| 7,977,763 B2 | 7/2011 | Lin et al. |
| 7,982,441 B2 | 7/2011 | Crowther et al. |
| 8,030,908 B2 | 10/2011 | Huang |
| 8,044,645 B2 | 10/2011 | Zambetti et al. |
| 8,053,890 B2 | 11/2011 | Puma et al. |
| 8,208,878 B1 | 6/2012 | Hardy et al. |
| 8,238,122 B2 | 8/2012 | Torrico-Bascope et al. |
| 8,576,000 B2 * | 11/2013 | Kim et al. .................... 327/565 |
| 8,592,966 B2 * | 11/2013 | Wood et al. .................. 257/690 |
| 2002/0096697 A1 | 7/2002 | Tihanyi |
| 2005/0225307 A1 | 10/2005 | Sato et al. |
| 2006/0291260 A1 | 12/2006 | Nakashima |
| 2007/0195563 A1 | 8/2007 | Shiraishi et al. |
| 2009/0086514 A1 | 4/2009 | Fornage et al. |
| 2010/0127683 A1 | 5/2010 | Uno et al. |
| 2011/0043173 A1 | 2/2011 | Blaumeiser et al. |
| 2011/0090716 A1 | 4/2011 | Asuke et al. |
| 2011/0248812 A1 | 10/2011 | Hu et al. |
| 2012/0002446 A1 | 1/2012 | Madawala et al. |
| 2013/0229830 A1 | 9/2013 | Barnette et al. |
| 2013/0229831 A1 | 9/2013 | Barnette et al. |
| 2014/0132234 A1 | 5/2014 | Barnette et al. |
| 2014/0132237 A1 | 5/2014 | Barnette et al. |

FOREIGN PATENT DOCUMENTS

| | | |
|---|---|---|
| TW | 271917 B1 | 1/2007 |
| WO | WO 2010/002906 A2 | 1/2010 |

OTHER PUBLICATIONS

Kudva et al.; "Fully-Integrated On-Chip DC-DC Converter With a 450X Output Range", 2010 IEEE Custom Integrated Circuits Conference (CICC), Sep. 2010, pp. 1-4, IEEE.org (online), doi: 10.1109/

(56) References Cited

OTHER PUBLICATIONS

CICC.2010.5617588, URL: http://ieeexplore.ieee.org/stamp/stamp.jsp?tp=&arnumber=5617588&isnumber=5617377.
Garner et al., "The Integration of High-Side and Low-Side Ligbts on Partial Silicon-On-Insulator", Solid-State Electronics, vol. 44, Issue 6, Jun. 2000, pp. 929-935, sciencedirect.com (online), doi: 10.1016/S0038-1101(00)00018-6, URL: http://dx.doi.org/10.1016/S0038-1101(00)00018-6.
Padiyar, U.H., et al., "A System Level Solution to Improve VRM Efficiency", IEEE International Conference on Industrial Technology, Feb. 10-13, 2009, pp. 1-5, IEEE, USA, Digital Object Identifier: 10.1109/ICIT.2009.4939661.
Sullivan, C. R., "Computationally Efficient Winding Loss Calculation with Multiple Windings, Arbitrary Waveforms and Two- or Three-Dimensional Field Geometry", IEEE Transactions on Power Electronics, Jan. 2001, pp. 142-150, vol. 16, No. 1, IEEE, USA, Digital Object Identifier: 10.1109/63.903999.
Kelly, S. et al., "Core Materials for High Frequency VRM Inductors", Power Electronics Specialists Conference, Jun. 17-21, 2007, pp. 1767-1772, IEEE, USA, Digital Object Identifier: 10.1109/PESC.2007.4342267.
Prabhakaran, S., et al., "Fabrication of Thin-Film V-Groove Inductors Using Composite Magnetic Materials", International Workshop on Integrated Power Packaging, Jul. 2000, pp. 102-105, Digital Object Identifier: 10.1109/IWIPP.2000.885191, IEEE, USA.
Ghahary, A., "Fully Integrated DC-DC Converters", Power Electronics Technology, Aug. 2004, pp. 24-27, Penton Business Media Inc., Overland Park, KS, USA.
Park, J., et al., "Fully Integrated Micromachined Inductors With Electroplated Anisotropic Magnetic Cores", Thirteenth Annual Applied Power Electronics Conference and Exposition, Feb. 15-19, 1998, pp. 379-385 vol. 1, Digital Object Identifier: 10.1109/APEC.1998.647718, IEEE, USA.
Yao, K., et al., "Design Considerations for VRM Transient Response Based on the Output Impedance", IEEE Transactions on Power Electronics, Nov. 2003, pp. 1270-1277, vol. 18, No. 6, Digital Object Identifier: 10.1109/TPEL.2003.818824, IEEE, USA.
Parker, S., "Characterizing Properties of Magnetic Films Deposited on Silicon Wafers", May 2009, pp. 39-42, Tuscaloosa, AL, USA.
"Physics Lecture 17—Magnetic Fields cont'd.", upenn.edu (online), accessed Sep. 7, 2011, 5 pages, URL: http://www.physics.upenn.edu/courses/gladney/phys151/lectures/lecture_mar_07_2003.shtml#tth_sEc8.3.
Wang, N., et al.,"Micro-fabricated inductors on silicon for DC-DC converters operating at tens MHz", powersoc.org (online), accessed Feb. 10, 2012, 1 page, URL: http://www.powersoc.org/PwrSOC08/Presentations/Received/Poster%20P12%20-%20Ningning%20Wang%20et%20al.%20-%20Micro-fabricated%20inductors%20on%20silicon%20for%20DC-DC%20converters%20operating%20at%20tens%20of%20MHz.pdf.
O'Donnell, T., et al., "Microfabricated Inductors for 20 MHz Dc-Dc Converters", Twenty-Third Annual IEEE Applied Power Electronics Conference and Exposition, Feb. 24-28, 2008, pp. 689-693, Digital Object Identifier: 10.1109/APEC.2008.4522796, IEEE, USA.
Phillips, M.D, et al., "A Novel Toroidal Inductor Structure With Through-Hole Vias in Ground Plane", IEEE Transactions on Microwave Theory and Techniques, Jun. 2006, pp. 1325-1330, vol. 54, No. 4, Digital Object Identifier: 10.1109/TMTT.2006.871352, IEEE, USA.
Raieszadeh, M.,"High-Q Integrated Inductors on Trenched Silicon Islands", Thesis, Apr. 12, 2005, pp. 1-92, Georgia Institute of Technology, USA.
Kelly, S., et al., "Core Materials for High Frequency VRM Inductors", IEEE Power Electronics Specialists Conference, Jun. 17-21, 2007, pp. 1767-1772, Digital Object Identifier: 10.1109/PESC.2007.4342267, IEEE, Orlando, FL, USA.
Rincon-Mora, G.A., et al., "How to fully integrate switching DC-DC supplies with inductor multipliers", EE Times Design, Dec. 18, 2005, pp. 1-3, UBM Electronics, San Francisco, CA, USA.
"Toroidal Magnetic Field," hyperphysics.phy-astr.gsu.edu (online), accessed Sep. 7, 2011, 3 pages, URL: http://hyperphysics.phy-astr.gsu.edu/hbase/magnetic/toroid.html.
Steiner, et al., "A Tuning Transformer for the Automatic Adjustment of Resonant Loop Antennas in RFID Systems", 2004 IEEE International Conference on Industrial Technology (IEEE ICIT '04), Dec. 2004, pp. 912-916, IEEE, Digital Object Identifier: 10.1109/ICIT.2004.1490196.
Wegleiter, et al., "Automatic Antenna Tuning Unit to Improve RFID System Performance", IEEE Transactions on Instrumentation and Measurement, May 2011, pp. 2797-2803 (section III), vol. 60, Issue 8, IEEE, Digital Object Identifier: 10.1109/TIM.2011.2122390.
Taheri, M., et al., "Analysis and Design of a New Soft Switching Interleaved Converter Using an Integrated Transformer", 2011 $2^{nd}$ Power Electronics, Drive Systems and Technologies Conference (PEDSTC), Feb. 16-17, 2011, pp. 98-103, IEEE, New York, Digital Object Identifier: 10.1109/PEDSTC.2011.5742505.
Xuechao, L., et al., "A Non-isolated Voltage Regulator Module With Integrating Coupled-Inductor", from IEEE $36^{th}$ Power Electronics Specialists Conference 2005 (PESC '05), Jun. 16, 2005, pp. 438-442, IEEE, New York, Digital Object Identifier: 10.1109/PESC.2005.1581661.
Cho, et al., "A Novel Transformer Winding for Phase Shift Full Bridge Converter", 31st International Telecommunications Energy Conference 2009 (INTELEC 2009), Oct. 18-22, 2009, pp. 1-5, IEEE, New York, Digital Object Identifier: 10.1109/INTLEC.2009.5351785.
Do, H.L., "Interleaved Boost Converter With a Single Magnetic Component", IET Power Electronics, Aug. 2011, pp. 842-849, vol. 4, Issue. 7, IEEE, United Kingdom, Digital Object Identifier: 10.1049/iet-pel.2010.0256.
Qian, T., et al., "Coupled Input-Series and Output-Parallel Dual Interleaved Flyback Converter for High Input Voltage Application", IEEE Transactions on Power Electronics, Jan. 2008, pp. 88-95, vol. 23, Issue. 1, IEEE, New York, Digital Object Identifier: 10.1109/TPEL.2007.911867.
University of Colorado, Boulder, "The Flyback Converter", Lecture Notes ECEN 4517: Power Electronics and Photovoltaic Power Systems Laboratory, Department of Electrical and Computer Engineering, Spring 2011, pp. 111, University of Colorado, Boulder, CO.
Dixon, "Inductor and Flyback Transformer Design", 2001 Magnetics Design Handbook—MAG100A, Mar. 15, 2001, pp. 5-1 to 5-19, Section 5, Texas Instruments Incorporated, Dallas, Texas, USA.
Dixon Jr, L., "The Effects of Leakage Inductance on Switching Power Supply Performance", 2001 Magnetics Design Handbook—MAG100A, Mar. 15, 2001, pp. R4 to R7, Texas Instruments Incorporated, Dallas, TX, USA.
Office Action, U.S. Appl. No. 13/410,395, Apr. 16, 2014, pp. 1-16.
Notice of Allowance, U.S. Appl. No. 13/707,727, Apr. 11, 2014, pp. 1-7.

* cited by examiner

*Prior Art*

Prior Art DC-DC Converter
100

Prior Art DC-DC Converter
Timing Diagram 130

Identity Switching DC-DC
Converter Timing Diagram
230

Identity Switching DC-DC
Converter 300

Identity Switching DC-DC
Converter On Chip 500

Micro-power-switching Phase
502

Multiple DC-DC Converters
On Chip 600

OPERATING AND MANUFACTURING A DC-DC CONVERTER

CROSS-REFERENCE TO RELATED APPLICATION

This application is a continuation application of and claims priority from U.S. patent application Ser. No. 14/050,007, filed on Oct. 9, 2013.

BACKGROUND OF THE INVENTION

1. Field of the Invention

The field of the invention is power conversion, or, more specifically, methods and apparatus for operating and manufacturing a DC-DC converter.

2. Description of Related Art

Computer system technology is continually advancing. Data centers, for example, now include hundreds or thousands of servers. Given the number of servers in a data center, decreasing the physical size or 'footprint' of the servers is a top priority for server system and server component designers. One area of focus, for example, is in reducing the size of Direct Current ('DC')-DC converters that distribute DC power amongst components of servers and the like.

In current art, reducing the size of such DC-DC converters is limited, at least in part, by the need for a plurality output inductors and a filter capacitor. Some DC-DC converters of the prior art have implemented designs to somewhat reduce the physical footprint of the inductors and the capacitor by utilizing a single magnetic core for multiple inductors, or a multiple magnetic core coupled to behave as one single unit—an implementation of an indirectly coupled inductor. FIG. 1A, for example, sets forth a prior art DC-DC converter that includes an indirectly coupled inductor.

The example DC-DC converter (100) of FIG. 1A includes two power-switching phases (132, 134). Each phase includes two switches: a high-side switch (102, 106), and a low-side switch (104, 108). Each high-side switch (102, 106) includes a control input (110, 114) to activate the switch. Upon activation, each high-side switch (102, 106) couples a voltage source ($V_{IN}$) to an indirectly coupled inductor (118). Each low-side switch (104, 108) also includes a control input (112, 116) to activate the switch. Upon activation, each low-side switch (104, 108) couples one coil of indirectly coupled inductor (118) to a ground voltage.

Coupled inductors come in two forms: indirectly coupled and directly coupled. The dots depicted in the example of FIG. 1A indicate the coupled inductor (118) is an indirectly coupled inductor. The dot convention specifies the flow of current in a coupled inductor as: when current flows 'into' one dot, current is induced in the alternate coil of the coupled inductor and flows 'out of' the other dot. Thus, in an indirectly coupled inductor, current generally flows in the same direction in both coils of the coupled inductor.

The example prior art DC-DC converter (100) of FIG. 1A also includes an output capacitor (120) that operates as a lowpass filter and a load, represented by a resistor (122).

FIG. 1B sets forth an example timing diagram (130) of activating the switches (102, 112, 106, 116) of the prior art DC-DC converter (100) of FIG. 1A. In the example timing diagram of FIG. 1B, switch (102) is activated between time $T_0$ and $T_1$, then deactivated from $T_1$ through $T_3$. Switch (112) is not activated from time $T_0$ and $T_1$, but is activated at time $T_1$ through $T_3$. Switch (114) is only activated between time $T_2$ to $T_3$. Switch (116) is activated from time $T_0$ to $T_2$ and activated again at time $T_3$. The timing diagram (130) in the example of FIG. 1B specifies that activation of the high-side switch and low-side switch in a single phase of the prior art DC-DC converter (100) of FIG. 1 is asynchronous. Further, during any one given time period, two of the switches are activated at the same time. Although the indirectly coupled inductor in the example prior art DC-DC converter (100) of FIG. 1A represents a reduction in size relative to two, discrete inductors, operating the indirectly coupled prior art DC-DC converter (100) in accordance with the timing diagram of FIG. 1B limits any further inductor and capacitance reduction due to many factors, including for example: efficiency, current ripple, and so on. Other similar circuits of the prior art also has several limitations including:

- Prior art circuits rely on an equal DC current to flow through windings of the inductor to gain flux canceling affects, which requires highly accurate current sensing;
- Because current flow through all legs of the inductor of the prior art occurs simultaneously no accurate current sensing can take place with industry standard DCR (DC resistance) sensing;
- Prior art circuits with indirectly coupled inductors employ loops to form the indirectly coupled inductors which creates additional series resistance that inversely affects regulator efficiently;
- In prior art circuits, the leakage inductance sets the current ripple of the design, so there is a minimum leakage inductance that must exist, bounding transient performance of the design, and requiring a higher switching frequency; and
- Adding additional phases in parallel in prior art circuits inversely affects the transient performance of design, where the slew rate the load can be supplied is bounded the voltage input, number of phases, and leakage inductance.

SUMMARY OF THE INVENTION

Methods, apparatus, and products of operating a DC-DC converter are disclosed in this specification. The DC-DC converter includes: a semiconductor die having a first portion and second portion, the first portion surrounding the second portion, the first portion having a p-type top side and an n-type bottom side, the second portion having an n-type top side and a p-type bottom side; a plurality of micro-power-switching phases including magnetic material, with each phase including: a high-side switch with a control input for activating the high-side switch, the high-side switch implemented in a cell of the n-type top side of the second portion of the semiconductor die; a low-side switch with a control input for activating the low-side switch, the low-side switch implemented in a cell of the p-type top side of the first portion of the semiconductor die; and an output node, the high-side switch and low-side switch electrically coupled to the output node through the magnetic material, where: the output node of each phase extrudes through the magnetic material to form, in each phase, a torodial inductor with a single loop coil, and to form, for the plurality of phases, a directly coupled inductor; the output node of each micro-power-switching phase is coupled to a filter and a load; each high-side switch is configured, when activated, to couple a voltage source to the phase's single loop coil; and the low-side switch of each phase is configured, when activated, to couple the phase's single loop coil to a ground voltage; and the method includes: alternatively activating each switch, where no two switches of any phase are activated at the same time.

Methods of manufacturing such DC-DC converters are also disclosed in this specification and include: providing a semiconductor die having a p-type side and an n-type side, the p-type side including a top side and the n-type side including a bottom side of the semiconductor die; removing an interior portion of the semiconductor die from the interior of the semiconductor die, the removal creating a hole in the semiconductor die defined in shape by an exterior portion not removed from the semiconductor die; flipping the interior portion of the semiconductor die so that the interior portion of the semiconductor die is oriented with the n-type side being the top side and the p-type side being the bottom side; inserting the interior portion into the hole of the semiconductor die; fabricating in the top side of the interior portion a plurality of cells, each cell including a high-side switch having a control input for activating the high-side switch; fabricating in the top side of the exterior portion a plurality of cells, each cell including a low-side switch having a control input for activating the low-side switch; sputtering a magnetic material on the top side of semiconductor die; burrowing a tunnel into the magnetic material for each cell fabricated on the semiconductor die; and applying on the magnetic material and within the burrowed tunnels, conductive material thereby electrically coupling pairs of high-side and low-side switches to the conductive material through the magnetic material, with each pair forming a micro-power-switching phase, where the conductive material forms an output node of the phase, and the conductive material in the burrowed tunnels forms, in each phase, a torodial inductor with a single loop coil and, for the plurality of phases, a directly coupled inductor.

The foregoing and other objects, features and advantages of the invention will be apparent from the following more particular descriptions of exemplary embodiments of the invention as illustrated in the accompanying drawings where like reference numbers generally represent like parts of exemplary embodiments of the invention.

DETAILED DESCRIPTION OF EXEMPLARY EMBODIMENTS

Figure 2A:
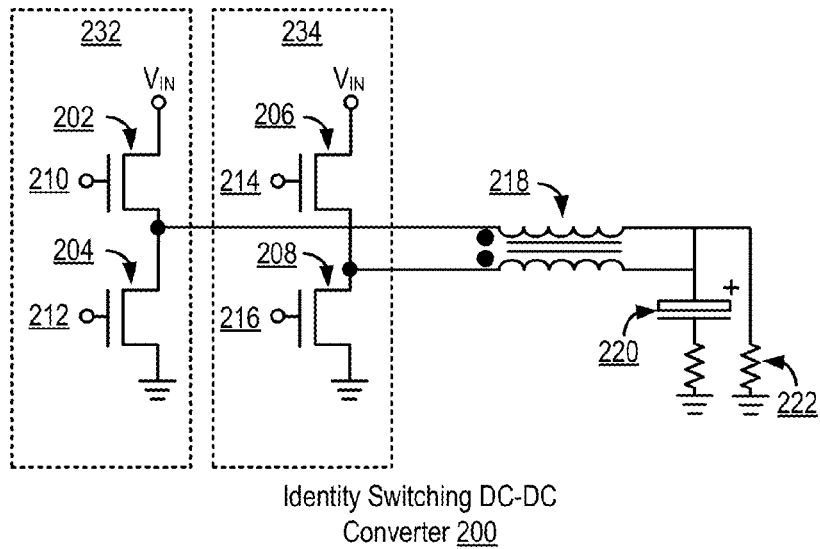
FIG. 2A sets forth sets forth an identity switching DC-DC converter that includes a directly coupled inductor, operated in accordance with embodiments of the present invention.

Exemplary methods and apparatus for operating a DC-DC converter in accordance with embodiments of the present invention are described with reference to the accompanying drawings, beginning with FIG. 2A. FIG. 2A sets forth sets forth an identity switching DC-DC converter that includes a directly coupled inductor, operated in accordance with embodiments of the present invention.

Figure 1A:
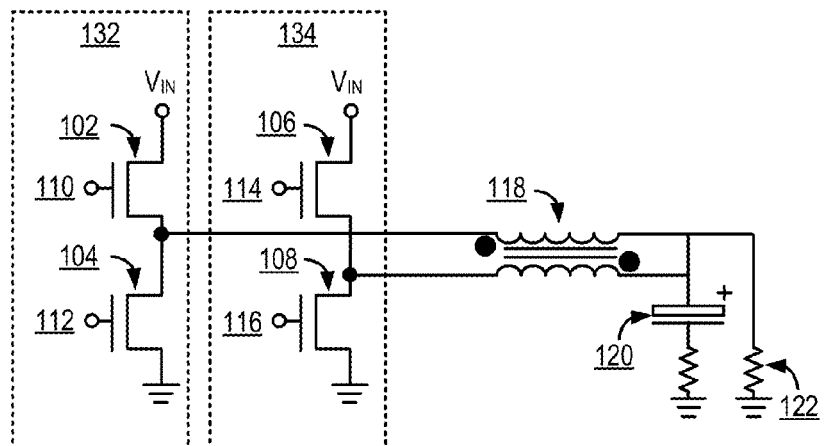
FIG. 1A sets forth a prior art DC-DC converter that includes an indirectly coupled inductor.
Figure 1B:
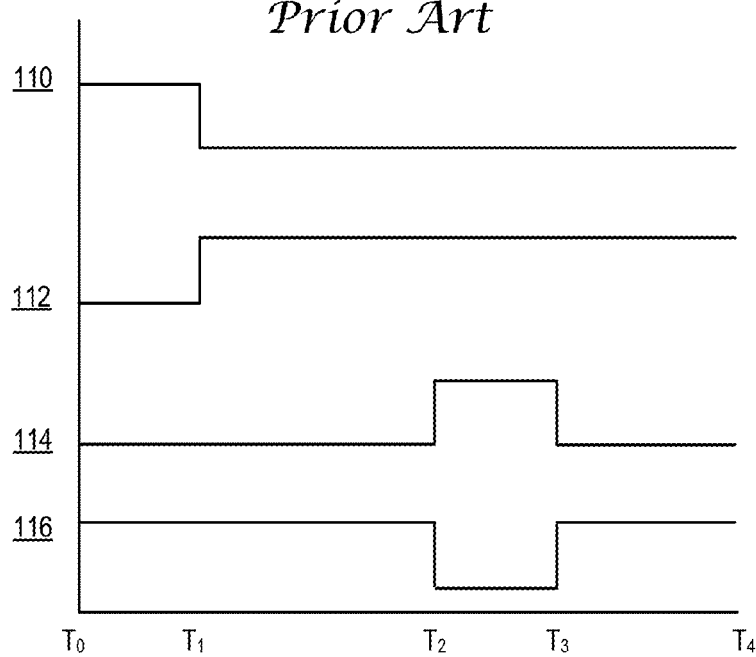
FIG. 1B sets forth an example timing diagram of activating switches of the prior art DC-DC converter of FIG. 1A.

The example identity switching DC-DC converter (200) of FIG. 2A includes a directly coupled inductor (218) that includes a first coil element and a second coil element. The first coil element and second coil element are coupled to an output filter—the capacitor (220)—and a load represented by a resistor (222). Unlike the prior art indirectly coupled inductor (118) of FIG. 1A, in the directly coupled inductor (218) in the example of FIG. 2A, current generally flows equal in magnitude and in the opposite direction in the coils of the coupled inductor. That is, when current enters one dot, current is induced to exit the other dot.

The example identity switching DC-DC converter (200) of FIG. 2A also includes two power-switching phases (232, 234). A first power-switching phase (232) includes a high-side switch (202) and a low-side switch (204). The high-side switch (202) is configured, when activated 180 degrees out of phase, by a control input (210), to couple a voltage source ($V_{IN}$) to the first coil element of the directly coupled inductor (218). The low-side switch (204) is configured, when activated by a control input (212), to couple the first coil element to a ground voltage.

The second power-switching phase (234) of the example identity switching DC-DC converter (200) of FIG. 2A includes a high-side switch (206) and a low-side switch (208). The high-side switch (206) of the second power-switching phase (234) is configured, when activated by a control input (214), to couple the voltage source ($V_{IN}$) to the second coil element of the directly coupled inductor (218). The low-side switch (208) of the second power-switching phase (234) is configured, when activated by a control input (216), to couple the second coil element to the ground voltage.

As will occur to readers of skill in the art, each of the switches (202, 204, 206, 208) in the example of FIG. 2A may be implemented as a Field Effect Transistor ('FET') or the like.

The identity switching DC-DC converter (200) of FIG. 2A is operated by alternatively activating each switch, where no two switches are activated at the same time. For further explanation, FIG. 2B sets forth an example timing diagram of activating switches of the identity switching DC-DC converter of FIG. 2A.

The DC-DC converter of FIG. 2A is described as an 'identity switching' converter due to the pattern of activating switches when viewed in a matrix or table. The example table below describes the timing of the switch activations as seen in the example timing diagram of FIG. 2B:

TABLE 1

Switch Activation Pattern For Identity
Switching DC-DC Converter (200) of FIG. 2A

| Control Input, Switch | $T_0$-$T_1$ | $T_1$-$T_2$ | $T_2$-$T_3$ | $T_3$-$T_4$ |
|---|---|---|---|---|
| CI (210), HS Switch (202) | 1 | 0 | 0 | 0 |
| CI (212), LS Switch (204) | 0 | 1 | 0 | 0 |
| CI (214), HS Switch (206) | 0 | 0 | 1 | 0 |
| CI (216), LS Switch (208) | 0 | 0 | 0 | 1 |

In the example Table 1 above, it can be seen that the control input and associated switches are alternatively activated (represented by a '1' in the table) in a manner that forms an identity of the table. Further, no two switches are activated at the same time. As depicted in Table 1 and the example timing diagram (230) of FIG. 2B: from time $T_0$-$T_1$, only the high-side switch (202) of the first power-switching phase (232) is activated; from time $T_1$-$T_2$, only the low-side switch (204) of the first power-switching phase (232) is activated; from time $T_2$-$T_3$, only the high-side switch (206) of the second power-switching phase (234) is activated; and from time $T_3$-$T_4$, only the low-side switch (208) of the second power-switching phase (234) is activated.

A '0' in the table above represents that the switch is tri-stated, 0V, kept in the off position. That is, in embodiments in which the switches are implemented as FETs, no gate drive is applied to the silicon gate. In this way, when not activated, each switch may introduce a high impedance path to the system. As such, each loop coil element is alternatively coupled to the voltage source, the ground voltage, and the high impedance path.

Readers of skill in the art will recognize that the phrase "no two switches are activated at the same time" may be read literally in ideal conditions where the switches are implemented as unidirectional switches with little to no switching response time. In other, less ideal conditions, however—such as implementations in which the switches are implemented as FETs having a body diode—the phrase "no two switches are activated at the same time" means that no two switches are activated at nearly or approximately the same time. That is, the phrase "no two switches are activated at the same time" does not exclude minor overlap, but instead describes switch activation over a much longer time period—the switching period or duty cycle of the switches as a while. Two switches, for example, such as the low-side switch of the first phase and the high-side switch of the second phase may be activated at the same time, but for only for a very short amount of time, in order to fully discharge the body diode of the low-side switch. In such an example, immediately before the low-side switch of the first phase is deactivated, the high-side switch of the second phase may be activated in order to drain current in the body diode. The two switches in this implementation are 'on' concurrently for a very minimal amount of time, not representing an appreciable portion of the switching period of the switches. The phrase, "no two switches are activated at the same time," then, may be thought of relative to switching schemes of the prior art in which two switches are activated concurrently for a very long time during the a switching period or for an entire duty cycle.

In this way, each phase is utilized at a 180 degree offset and each high-side switch for a period of time according to:

$$\frac{D}{N},$$

where D represents a duty cycle and N represents the number of power-switching phases. Each low-side switch is therefore activated for a period of time according to:

$$\frac{(1-D)}{N}.$$

In this way, the number of phases is inversely proportional to the duty cycle of activating the switches—that is, the 'effective' duty cycle—and thereby is inversely proportional to the inductance of the directly coupled inductor. Increasing the number of phases, therefore, decreases the inductance.

Figure 2B:
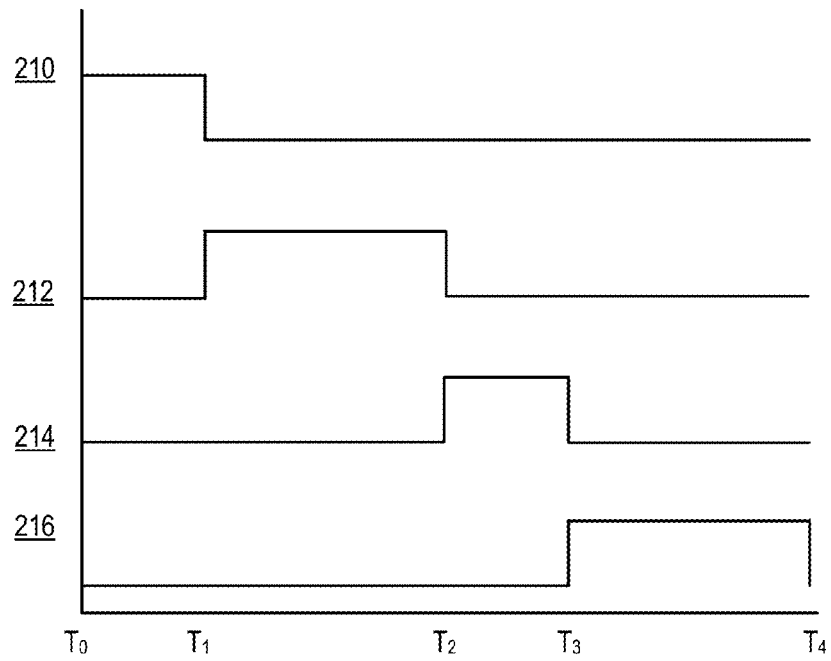
FIG. 2B sets forth an example timing diagram of activating switches of the identity switching DC-DC converter of FIG. 2A.

And the transfer function of the identity switching DC-DC converter (200) of FIG. 2A, when operated in accordance with the identity switching scheme in Table 1 and the timing diagram (230) of FIG. 2B is:

$$\frac{V_{OUT}}{V_{IN}} = \frac{D}{N}$$

Operating the example identity switching DC-DC converter (200) of FIG. 2A in accordance with the identity switching scheme in Table 1 and the timing diagram of FIG. 2B enables energy to be stored between deactivating the low-side switch (212) of the first power-switching phase (232) and activation of the high-side switch of the second power-switching phase (234), thus increasing overall system efficiency and reducing current ripple. That is, current ripple experienced by the magnetic core of the directly coupled inductor (218) and the output capacitor (220) is reduced, relative to circuits of the prior art, due in part to the effective reduced duty cycle of the switch activations. The current ripple experienced by the output filter capacitor (220) and the load (222) may be calculated as:

$$\frac{1}{f*L_{OL}}*\left(1-\frac{V_{OUT}}{V_{IN}}\right)*\frac{V_{OUT}}{N},$$

where f represents the frequency of alternatively activating each switch, $L_{OL}$ represents the open loop inductance of the directly coupled inductor, N represents the number of power-switching phases, $V_{IN}$ represents the voltage of the voltage source and $V_{OUT}$ represents the voltage experienced at the output filter and load.

Figure 3:
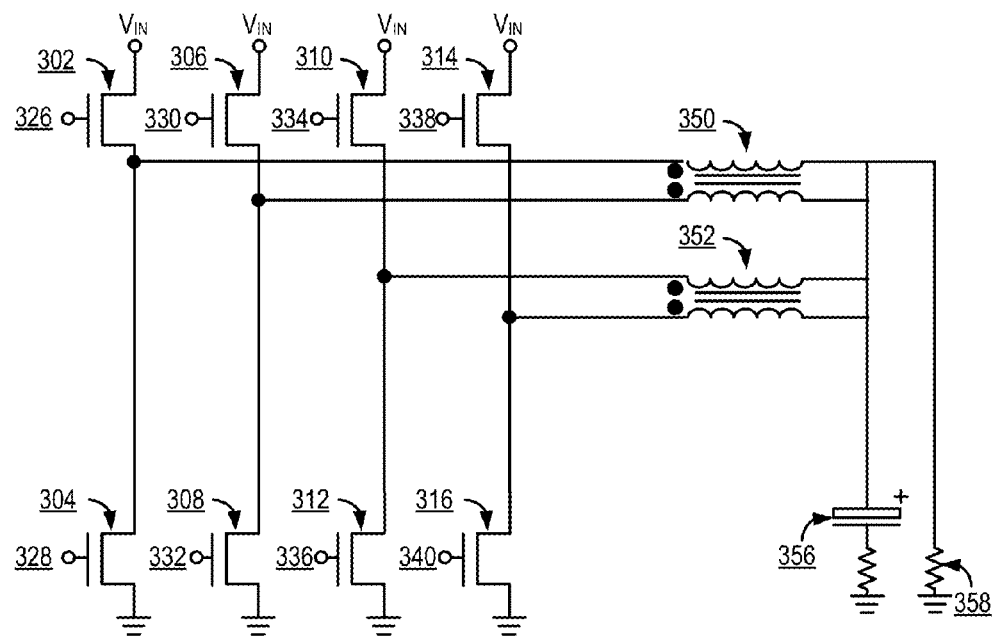
FIG. 3 depicts an identity switching DC-DC converter operated in accordance with embodiments of the present invention that includes a plurality of power-switching phases.

FIGS. 2A and 2B generally depict an identity switching DC-DC converter configured with two phases and operation thereof, but readers of skill in the art will recognize that an identity switching DC-DC converter operated in accordance with embodiments of the present invention may have any number of phases. For further explanation, therefore, FIG. 3 depicts an identity switching DC-DC converter (300) operated in accordance with embodiments of the present invention that includes a plurality of power-switching phases. The example DC-DC converter (300) of FIG. 3 includes four power-switching phases:
    a first power-switching phase that includes a high-side switch (302) and a low-side switch (304);

a second power-switching phase that includes a high-side switch (306) and a low-side switch (308);
a third power-switching phase that includes a high-side switch (310) and a low-side switch (312); and
a fourth power-switching phase that includes a high-side switch (314) and a low-side switch (316).

Each high-side switch (302, 306, 310, 314) includes a control input (326, 330, 334, 338) for activating the switch. Each low-side switch (304, 308, 312, 316) includes a control input (328, 332, 336, 340) for activating the switch. Each pair of phases is connected to a directly coupled inductor (350, 352), an output filter capacitor (356), and a load (358).

The switches in the example identity switching DC-DC converter (300) of FIG. 3 are alternatively activated and no two switches are activated concurrently. The following table sets forth the timing of switch activations in the example DC_DC converter (300) of FIG. 3:

TABLE 2

Switch Activation Pattern For Identity Switching DC-DC Converter (300) of FIG. 3

| Control Input, Switch | 0 Deg. | 0 Deg. | 180 Deg | 180 Deg. | 90 Deg. | 90 Deg. | 270 Deg. | 270 Deg. |
|---|---|---|---|---|---|---|---|---|
| CI (326), HS Switch (302) | 1 | 0 | 0 | 0 | 0 | 0 | 0 | 0 |
| CI (328), LS Switch (304) | 0 | 1 | 0 | 0 | 0 | 0 | 0 | 0 |
| CI (330), HS Switch (306) | 0 | 0 | 1 | 0 | 0 | 0 | 0 | 0 |
| CI (332), LS Switch (308) | 0 | 0 | 0 | 1 | 0 | 0 | 0 | 0 |
| CI (334), HS Switch (310) | 0 | 0 | 0 | 0 | 1 | 0 | 0 | 0 |
| CI (336), LS Switch (312) | 0 | 0 | 0 | 0 | 0 | 1 | 0 | 0 |
| CI (338), HS Switch (314) | 0 | 0 | 0 | 0 | 0 | 0 | 1 | 0 |
| CI (340), LS Switch (316) | 0 | 0 | 0 | 0 | 0 | 0 | 0 | 1 |

In the example Table 2 above, no two switches are activated concurrently. The second power-switching phase operates an offset of 180 degrees from the first power-switching phase. The fourth power-switching phase operates at an offset of 180 degrees from the third power-switching phase.

Figure 4:
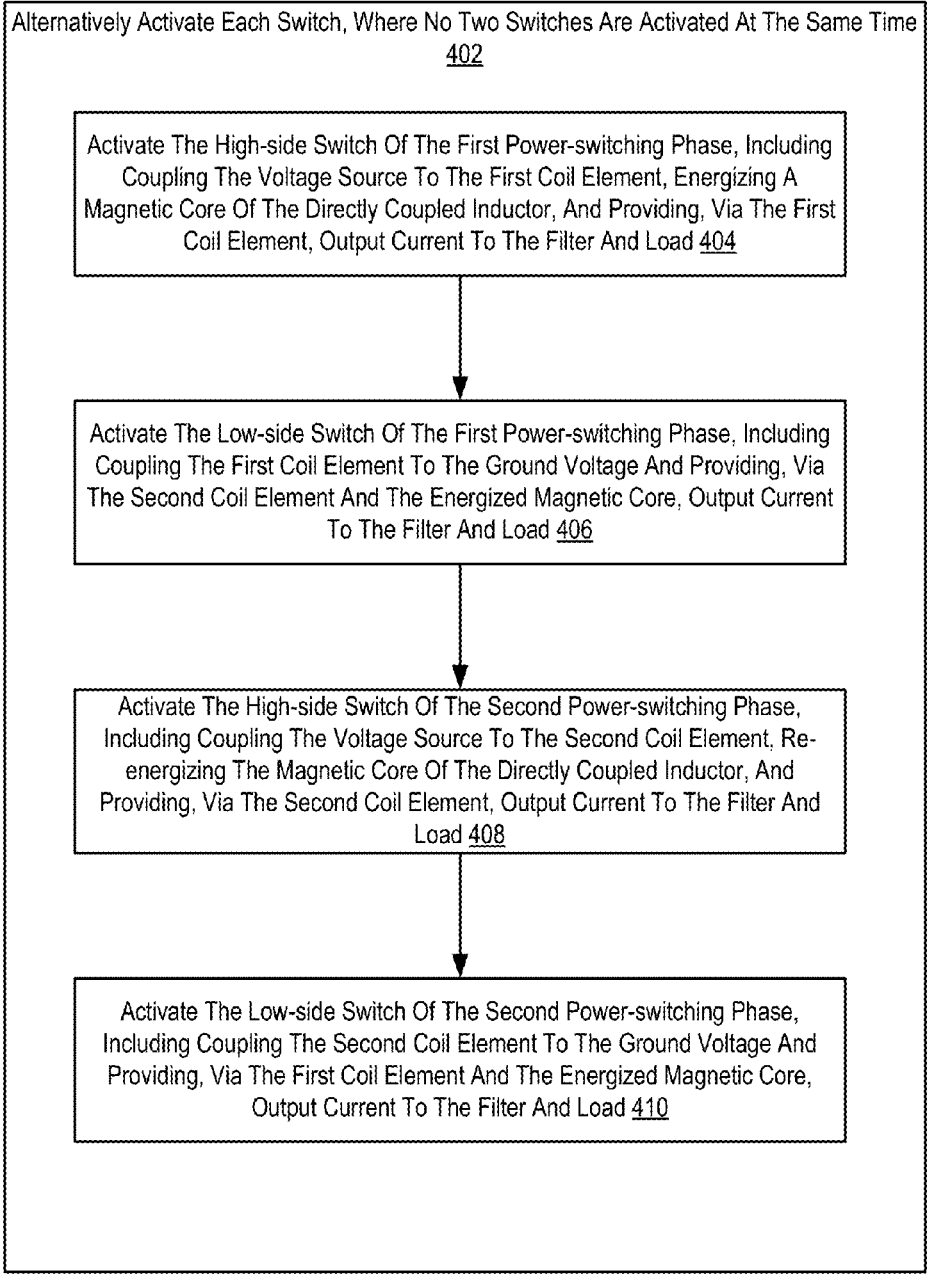
FIG. 4 sets forth a flow chart illustrating an example method of operation a DC-DC converter in accordance with embodiments of the present invention.

For further explanation, FIG. 4 sets forth a flow chart illustrating an example method of operation a DC-DC converter in accordance with embodiments of the present invention. The DC-DC converter of FIG. 4 is similar to the DC-DC converter of FIG. 2A including as it does: a directly coupled inductor (218) that includes a first coil element and a second coil element, the first and second coil elements coupled to an output filter—a capacitor (220)—and a load (222); and a plurality of power-switching phases including a first and second power-switching phase (232), the first power-switching phase (232) including includes a high-side switch (202) and a low-side switch (204), the high-side switch (202) configured, when activated by a control input (210), to couple a voltage source ($V_{IN}$) to the first coil element of the directly coupled inductor (218), the low-side switch (204) configured, when activated by a control input (212), to couple the first coil element to a ground voltage; the second power switching phase (234) also including a high-side switch (206) and a low-side switch (208), the high-side switch (206) configured, when activated by a control input (214), to couple the voltage source ($V_{IN}$) to the second coil element of the directly coupled inductor (218), and the low-side switch (208) configured, when activated by a control input (216), to couple the second coil element to the ground voltage.

The method of FIG. 4 includes alternatively activating (402) each switch, where no two switches are activated at the same time. In the method of FIG. 4, alternatively activating (402) each switch is carried out by: activating (404) the high-side switch of the first power-switching phase, including coupling the voltage source to the first coil element, energizing a magnetic core of the directly coupled inductor, and providing, via the first coil element, output current to the filter and load; activating (406) the low-side switch of the first power-switching phase, including coupling the first coil element to the ground voltage and providing, via the second coil element and the energized magnetic core, output current to the filter and load; activating (408) the high-side switch of the second power-switching phase, including coupling the voltage source to the second coil element, re-energizing the magnetic core of the directly coupled inductor, and providing, via the second coil element, output current to the filter and load; and activating (410) the low-side switch of the second power-switching phase, including coupling the second coil element to the ground voltage and providing, via the first coil element and the energized magnetic core, output current to the filter and load.

DC-DC converters configured to operate in accordance with embodiments of the present invention may be implemented in a variety of applications. One application, for example, in which a DC-DC converter configured to operate in accordance with embodiments of the present invention may be implemented, is a power supply for a computer.

In view of the explanations set forth above, readers will recognize that the benefits of operating a DC-DC converter in accordance with embodiments of the present invention include:
    reducing a physical footprint of a DC-DC converter without sacrificing efficiency or introducing an inordinate amount of current ripple;
    providing a DC-DC converter having current ripple characteristics independent of leakage inductance;
    providing a DC-DC converter that allows filter capacitance reductions, thereby reducing the need for large physical design layouts;
    providing a DC-DC converter with a coupled inductor that does not rely on flux cancelation of equal current flowing through loop coil elements to improve system performance; and
    providing a DC-DC converter having a coupled inductor in which current flow may be accurately and precisely measured through use of industry standard DCR current sensing.

The space saving benefits provided by the example DC-DC converters described above, enable such DC-DC converters to be implemented on chip—this is within an integrated circuit or on a silicon die. For further explanation, therefore, FIG. 5A sets forth a diagram of an identity switching DC-DC converter on a chip. The chip in the example of FIG. 5A includes a plurality of micro-power-switching ('MPS') phases (502). The plurality of MPS phases (502) also include a magnetic material, described below in greater detail. The magnetic material (508) in the example DC-DC converter on chip of FIG. 5A may be formed through electrolysis, through magnetic material sputtering, and in other ways as will occur to readers of skill in the art.

Figure 5A:
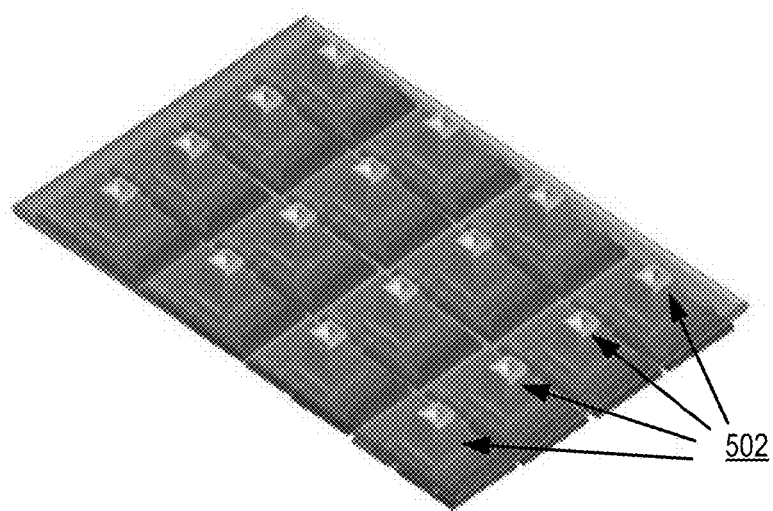
FIG. 5A sets forth a diagram of an identity switching DC-DC converter on a chip.
Figure 5B:
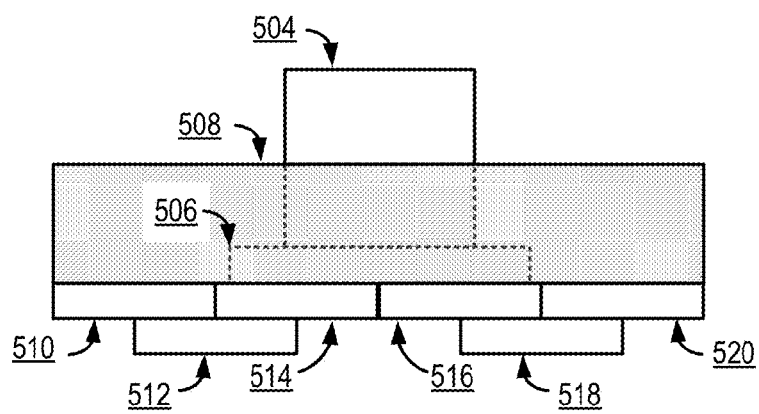
FIG. 5B depicts a cross sectional diagram of a single MPS phase.

For further explanation, FIG. 5B depicts a cross sectional diagram of a single MPS phase (502). Only one MPS phase (502) is depicted in the example of FIG. 5B for purposes of clarity, but readers of skill in the art will recognize that an identity switching DC-DC converter on a chip, such as the chip (500) in FIG. 5A, may include any number of such MPS phases, where each MPS phase's output is coupled to the other MPS phases' outputs to form one single output connected to an output filter and a load.

The example MPS phase (502) of FIG. 5B includes a high-side switch (a FET) formed of a drain (510), a source (514), and a gate (512). The gate (512) is configured as a control input for activating the high-side switch. The MPS phase (502) of FIG. 5B also includes a low-side switch formed of a source (520), drain (516) and a gate (518). The gate (518) is configured as a control input for activating the high-side switch. The example MPS phase (502) of FIG. 5B also includes and an output node (504) which is coupled to the drain (514) and source (516) via a silicon connection node (506).

The output node (504) of the MPS phase (502) of FIG. 5B extrudes through the magnetic material (508) to form a torodial inductor with a single loop coil. That is, the output node is the single loop coil of an inductor. Although not depicted in the example of FIG. 5B or 5A, the output node (504) of each micro-power-switching phase is coupled to a filter and a load.

The high-side switch (the combination of 510, 512, 514) is configured, when activated, to couple a voltage source (not shown) to the MPS phase's single loop coil formed by the extrusion of the output node (504) through the magnetic material (508). The low-side switch of the MPS phase (502) in the example of FIG. 5B is configured, when activated, to couple the MPS phase's single loop coil to a ground voltage (not shown).

Turning back to the example chip (500) of FIG. 5A, the aggregation of plurality of MPS phase's output nodes (504) extruding through the magnetic material (508), forms for the plurality of phases, a directly coupled inductor similar to the directly coupled inductor of FIG. 2A.

The identity switching DC-DC converter on chip (500) in the example of FIG. 5A, is operated in accordance with embodiments of the present invention by alternatively activating each switch, where no two switches of any phase are activated at the same time. Said another way, the silicon, magnetic material, and other conductive material in the example of FIG. 5A, implement on a chip a DC-DC converter similar to those depicted above in the examples of FIGS. 2A and 3.

Figure 6:
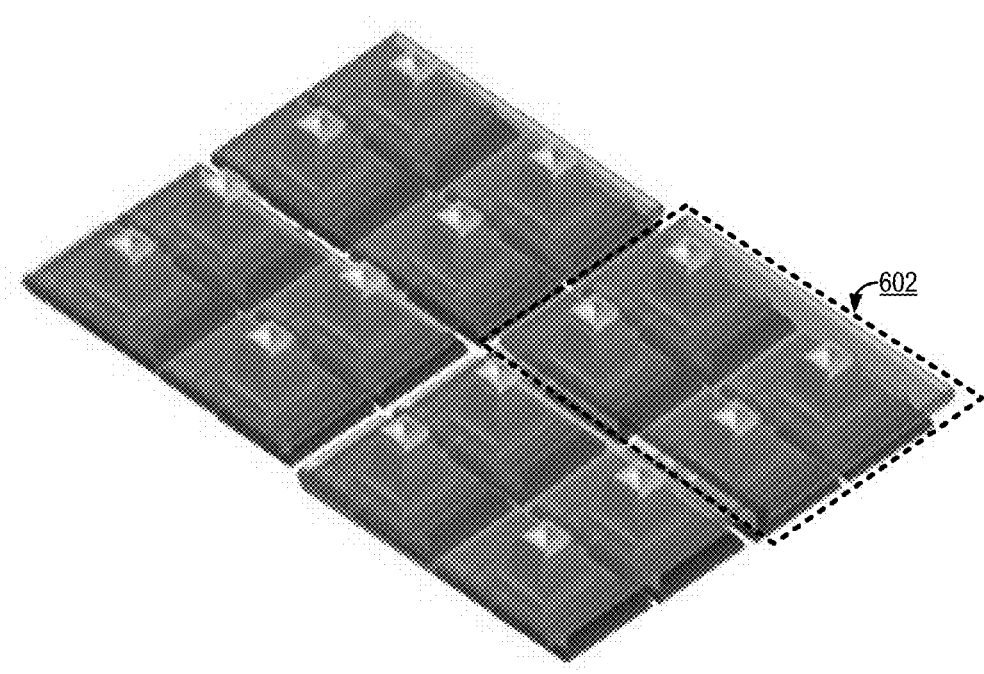
FIG. 6 sets forth a diagram of a chip that includes multiple DC-DC converters configured to operate in accordance with embodiments of the present invention.

The example identity switching DC-DC converter on chip (500) includes but one DC-DC converter formed of 16 integrated MPS phases. In some embodiments, however, the same number of phases may be utilized amongst several different DC-DC converters. That is, one chip may include a plurality of DC-DC converters that operate in accordance with embodiments of the present invention. For further explanation, FIG. 6 sets forth a diagram of a chip (600) that includes multiple DC-DC converters configured to operate in accordance with embodiments of the present invention. In the example of FIG. 6, the chip (600) includes a plurality of DC-DC converters, with each DC-DC converter includes a subset of the chip's plurality of MPS phase. Each subset is electrically and magnetically decoupled from other subsets. In the example chip (600) of FIG. 6, one subset (602) of four MPS phases is depicted. The subset (602) is electrically and magnetically decoupled from all other subsets.

Figure 7:
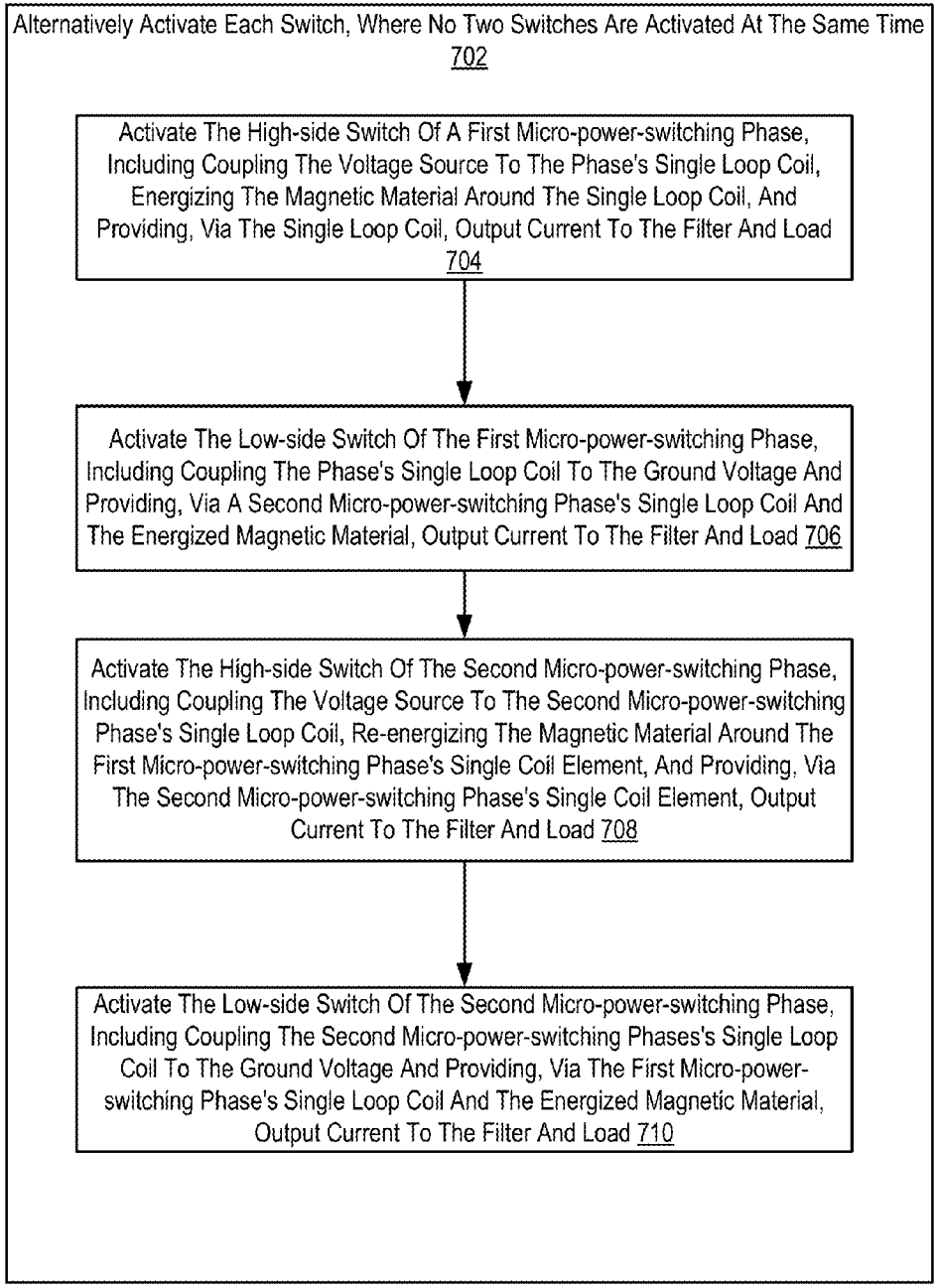
FIG. 7 sets forth a flow chart illustrating an example method of operating a DC-DC converter on a chip in accordance with embodiments of the present invention.

For further explanation, FIG. 7 sets forth a flow chart illustrating an example method of operating a DC-DC converter on a chip in accordance with embodiments of the present invention. The chip includes similar components, configured in similar ways, as the chip (500) in the example of FIG. 5. The method of FIG. 7 includes alternatively activating (702) each switch, where no two switches of any phase are activated at the same time. In the method of FIG. 7 alternatively activating (702) each switch is carried out by activating (702) the high-side switch of a first micro-power-switching phase, including coupling the voltage source to the phase's single loop coil, energizing the magnetic material around the single loop coil, and providing, via the single loop coil, output current to the filter and load; activating (704) the low-side switch of the first micro-power-switching phase, including coupling the phase's single loop coil to the ground voltage and providing, via a second micro-power-switching phase's single loop coil and the energized magnetic material, output current to the filter and load; activating (706) the high-side switch of the second micro-power-switching phase, including coupling the voltage source to the second micro-power-switching phase's single loop coil, re-energizing the magnetic material around the first micro-power-switching phase's single coil element, and providing, via the second micro-power-switching phase's single coil element, output current to the filter and load; and activating (708) the low-side switch of the second micro-power-switching phase, including coupling the second micro-power-switching phase's single loop coil to the ground voltage and providing, via the first micro-power-switching phase's single loop coil and the energized magnetic material, output current to the filter and load.

The example DC-DC converters on a chip as described above with respect to FIGS. 1-7 may be implemented in a variety of ways. In some embodiments, for example, the high-side switch and the low-side switch of a single MPS phase are implemented physically near, or in physical contact with, one another. In some cases, the high-side switches are implemented n-type and the low-side switches are implemented with p-type material. For a multi-phase construction in which each phase includes a high-side switch implemented physically near (effectively in contact with) a low-side switch, an n-type material must be located next to a p-type material for each phase.

In other embodiments, the high-side switch and low-side switch of a single MPS phase may be implemented in a way that does not require the p-type and n-type material of the switches to be in physical contact with one another. For further explanation, therefore, FIG. 8 sets forth a flow chart illustrating an example method of manufacturing a DC-DC converter on a chip in accordance with embodiments of the present invention. In describing the method of FIG. 8, references are made to elements depicted in FIGS. 9A-11B, which depict a DC-DC converter in various stages of the method of manufacturing set forth in FIG. 8.

Figure 8:
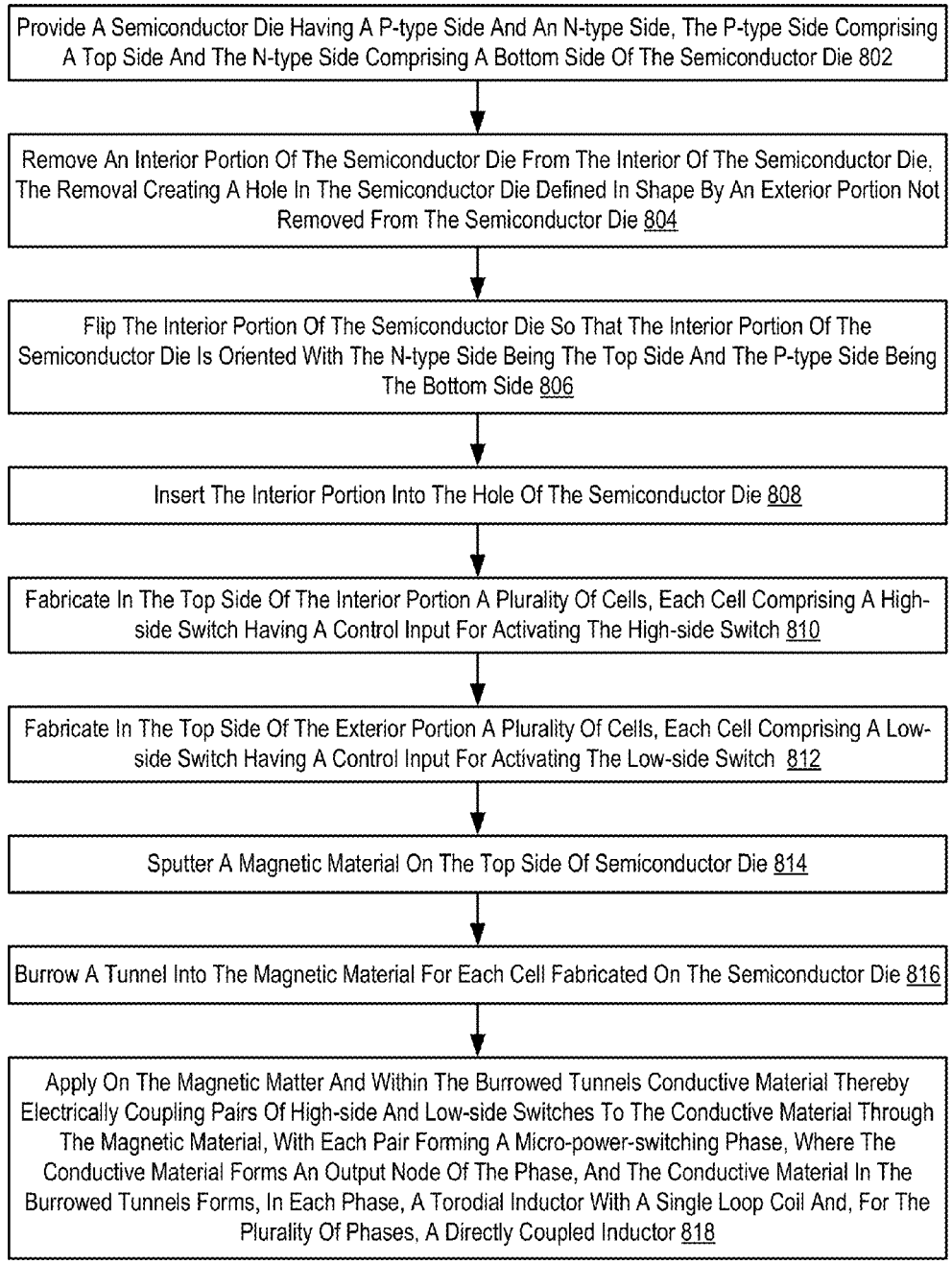
FIG. 8 sets forth a flow chart illustrating an example method of manufacturing a DC-DC converter on a chip in accordance with embodiments of the present invention.

The method of FIG. 8 includes providing (802) a semiconductor die (902 of FIG. 9A) having a p-type side (904) and an n-type side (906). In the method of FIG. 8, the p-type side (904) is the top side of the semiconductor die (902) and the n-type side (906) is the bottom side of the semiconductor die (902).

Figure 9A:
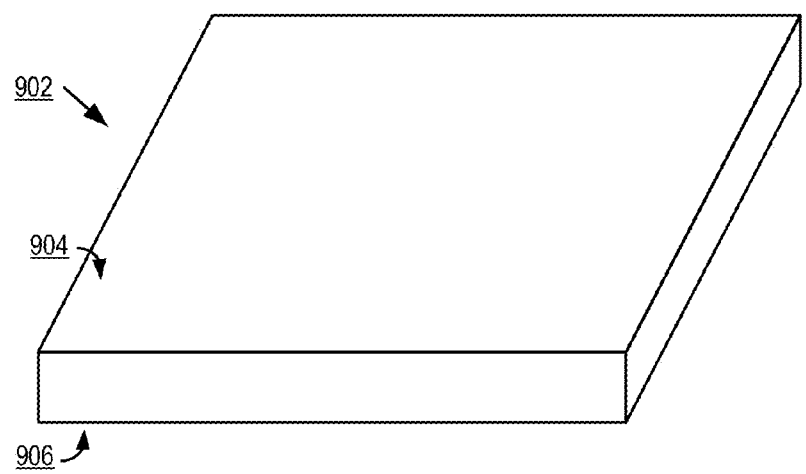
FIGS. 9A-11B depict a DC-DC converter during various stages of manufacturing in accordance with embodiments of the present invention.
Figure 9B:
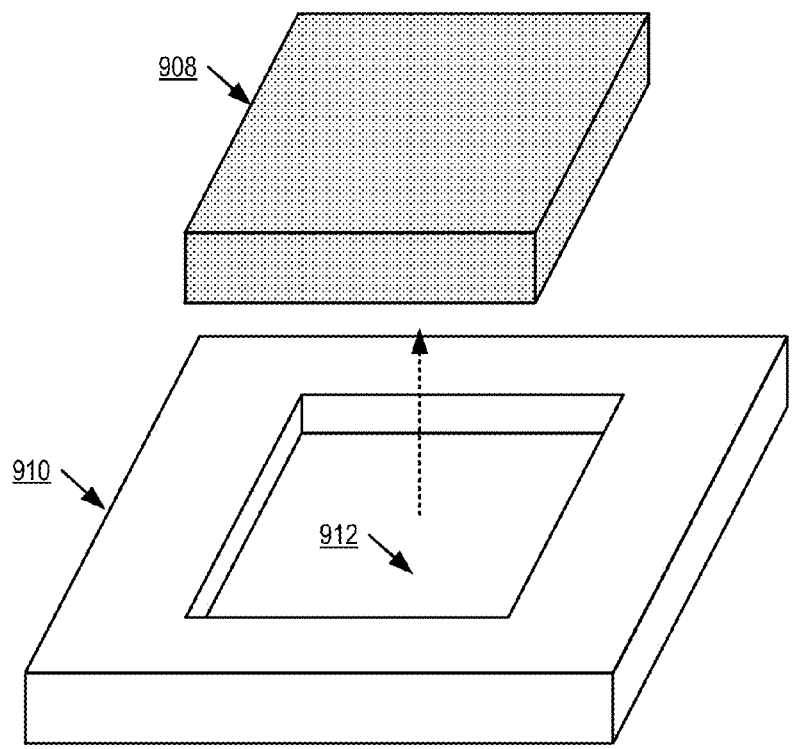

The method of FIG. 8 continues by removing (804) an interior portion (908 of FIG. 9B) of the semiconductor die from the interior of the semiconductor die (902). The removal creates a hole (912) in the semiconductor die defined in shape by an exterior portion (910) not removed from the semiconductor die (902). The hole (912) can be of any shape. In the example of FIG. 9B, the hole (912) is rectangular in shape.

Figure 10A:
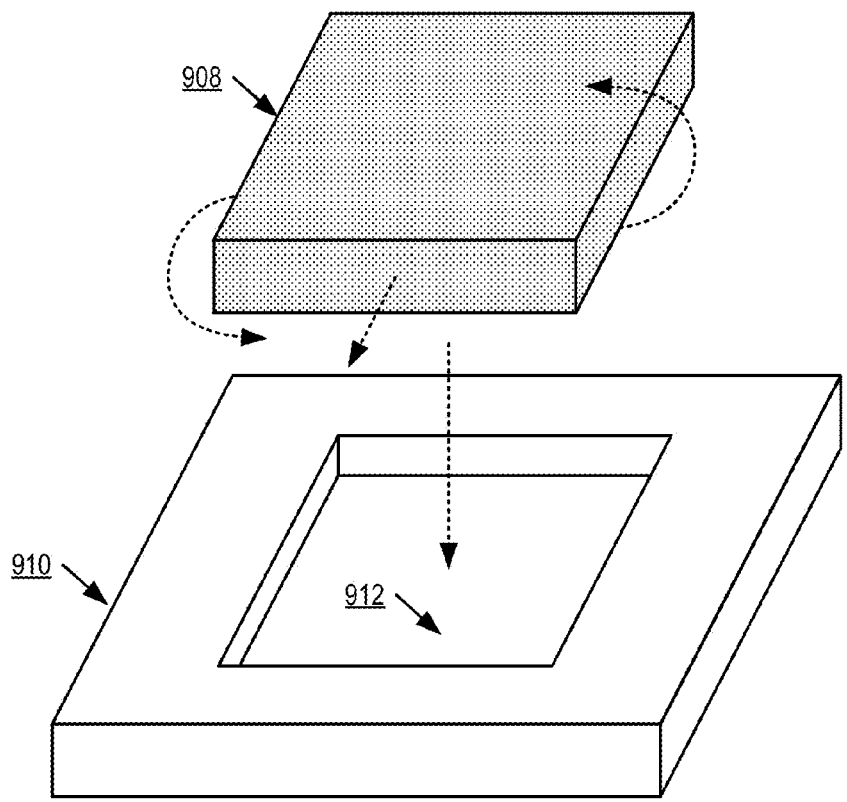

The method of FIG. 8 continues by flipping (806) the interior portion (908 in FIG. 10A) of the semiconductor die (902) so that the interior portion (908) of the semiconductor die is oriented with the n-type side (906) being the top side and the p-type side (904) being the bottom side. In the example of FIG. 10A, the interior portion is flipped about a central axis (909).

Once the interior portion (908) is flipped, the method of FIG. 8 continues by inserting (808) the interior portion (908 in FIG. 10B) into the hole (912) of the semiconductor die (902). In some embodiments, one or more adhesives may be applied to the outer faces of the interior portion (those faces that upon insertion into the hole will be nearly or completely in contact with the inner faces of the exterior portion) so that upon insertion into the hole (912), the outer faces of the interior portion (908) will adhere to the inner faces of the exterior portion (910).

Figure 11A:
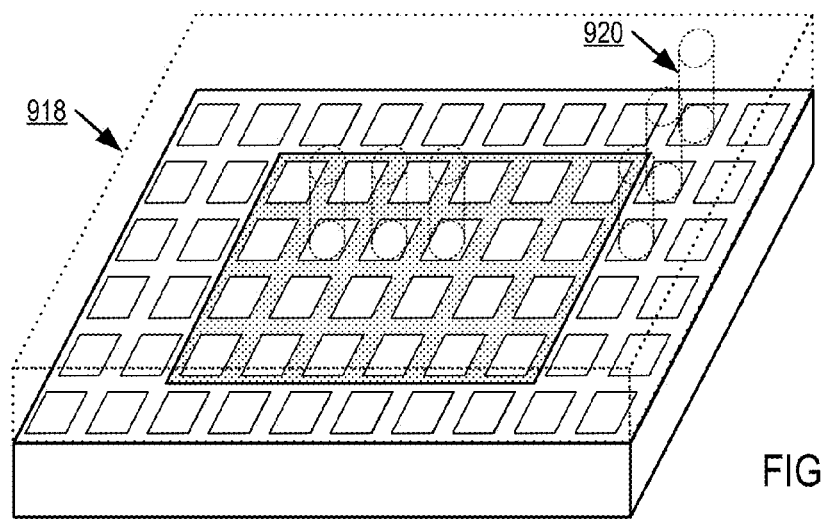
Figure 11B:
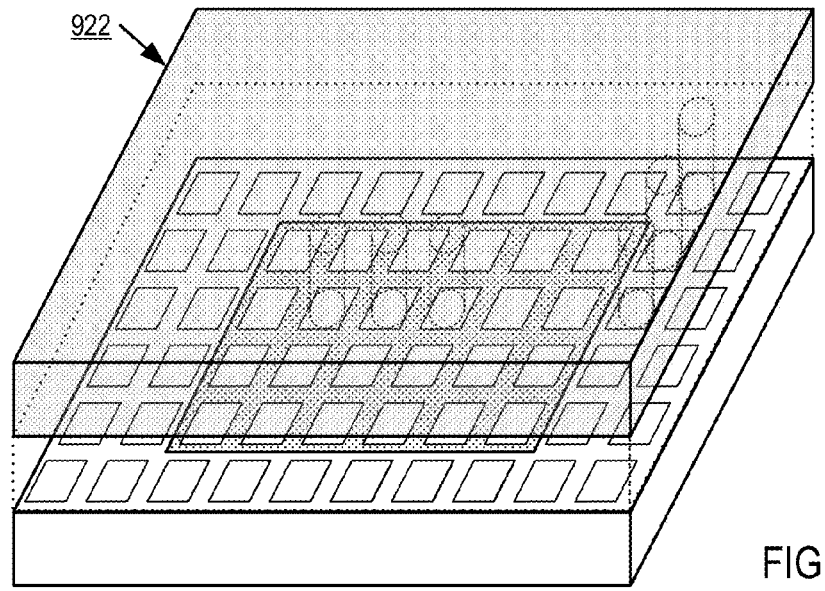

The method of FIG. 8 continues by fabricating (810) in the top side of the interior portion (908) a plurality of cells (914 in FIG. 11A). In the method of FIG. 8, each cell (914) fabricated in the top side of the interior portion (which, upon flipping is an n-type side of the semiconductor die) is a high-side switch having a control input for activating the high-side switch.

The method of FIG. 8 also includes fabricating (812) in the top side of the exterior portion (916) a plurality of cells (916). The top side of the exterior portion is a p-type side of the semiconductor die and each cell (916) fabricated on that side of the exterior portion is a low-side switch having a control input for activating the low-side switch.

The method of FIG. 8 also includes sputtering (814) a magnetic material (918) on the top side of semiconductor die and burrowing (920) a tunnel (920 of FIG. 11A) into the magnetic material for each cell (914, 916) fabricated on the semiconductor die. The example of FIG. 11A depicts a few tunnels (920) for clarity of explanation, not for limitation. Readers will understand that a tunnel may be burrowed for each and every cell fabricated on the semiconductor die.

The method of FIG. 8 also includes applying (816) on the magnetic material (918) and within the burrowed tunnels (920), conductive material (922 of FIG. 11B) thereby electrically coupling pairs of high-side and low-side switches to the conductive material through the magnetic material. Each pair forms a micro-power-switching phase. The conductive material forms an output node of the MPS phase and the conductive material (along with magnetic material) in the burrowed tunnels forms, in each phase, a torodial inductor with a single loop coil. The many tunnels with conductive material form, for the plurality of phases, a directly coupled inductor.

Figure 10B:
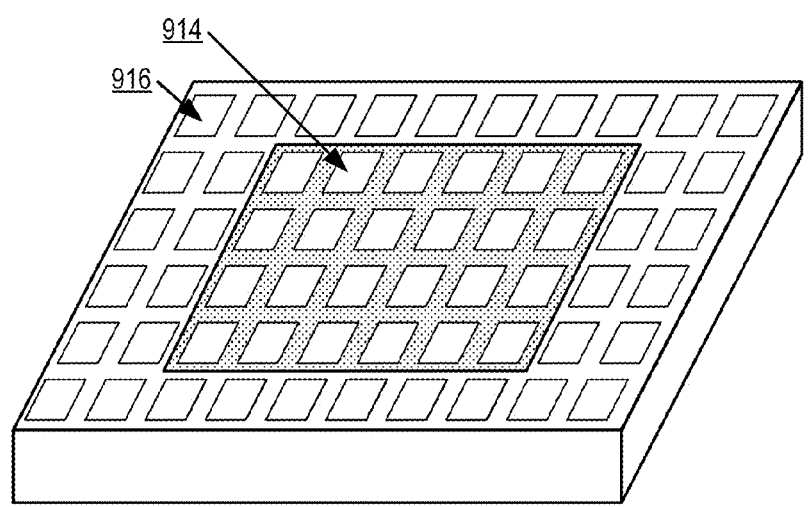

DC-DC converters, manufactured in accordance with the method described in FIG. 8, may be operated in manner similar to that of the example DC-DC converters described above with respect to FIGS. 1-7. Such a DC-DC converter is depicted in the example of FIG. 10B and includes a semiconductor die (902) with a first portion (910) and second portion (908), where the first portion surrounds the second portion, the first portion includes a p-type top side and an n-type bottom side and the second portion (908) includes an n-type top side and a p-type bottom side. Such a DC-DC converter also includes a number of micro-power-switching phases that include magnetic material. Each phase includes: a high-side switch (914) and a low-side switch (916). The high-side switch includes a control input for activating the high-side switch and is implemented in a cell of the n-type top side of the second portion (908) of the semiconductor die. The low-side switch (916) includes a control input for activating the low-side switch, where the low-side switch is implemented in a cell of the p-type top side of the first portion (910) of the semiconductor die. Each micro-power-switching phase also includes an output node (922) where the high-side switch and low-side switch are electrically coupled to the output node (922) through the magnetic material (918).

In such a DC-DC converter, the output node (922) of each phase extrudes through the magnetic material (918) to form, in each phase, a torodial inductor with a single loop coil, and to form, for the plurality of phases, a directly coupled inductor.

The output node of each micro-power-switching phase may be coupled to a filter and a load and each high-side switch is configured, when activated, to couple a voltage source to the phase's single loop coil while the low-side switch of each phase is configured, when activated, to couple the phase's single loop coil to a ground voltage. The voltage source may be provided as a power source plane at the bottom side of the exterior portion of the semiconductor die, while the ground voltage may be provided by a ground plane implemented at the bottom interior portion of the semiconductor die. Such a DC-DC converter may be operated by alternatively activating each switch, where no two switches of any phase are activated at the same time.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of operating a DC ('Direct Current')-DC converter on a chip, the chip comprising:
   a semiconductor die comprising a first portion and second portion, the first portion surrounding the second portion, the first portion comprising a p-type top side and an n-type bottom side, the second portion comprising an n-type top side and a p-type bottom side;
   a plurality of micro-power-switching phases comprising magnetic material, with each phase comprising: a high-side switch with a control input for activating the high-side switch, the high-side switch implemented in a cell of the n-type top side of the second portion of the semiconductor die; a low-side switch with a control input for activating the low-side switch, the low-side switch implemented in a cell of the p-type top side of the first portion of the semiconductor die; and an output node, the high-side switch and low-side switch electrically coupled to the output node through the magnetic material, wherein:
   the output node of each phase extrudes through the magnetic material to form, in each phase, a torodial inductor with a single loop coil, and to form, for the plurality of phases, a directly coupled inductor;
   the output node of each micro-power-switching phase is coupled to a filter and a load;
   each high-side switch is configured, when activated, to couple a voltage source to the phase's single loop coil; and
   the low-side switch of each phase is configured, when activated, to couple the phase's single loop coil to a ground voltage; and
   the method comprising: alternatively activating each switch, wherein no two switches of any phase are activated at the same time.

2. The method of claim 1 wherein alternatively activating each switch further comprises:
   activating the high-side switch of a first micro-power-switching phase, including coupling the voltage source to the phase's single loop coil, energizing the magnetic material around the single loop coil, and providing, via the single loop coil, output current to the filter and load;

activating the low-side switch of the first micro-power-switching phase, including coupling the phase's single loop coil to the ground voltage and providing, via a second micro-power-switching phase's single loop coil and the energized magnetic material, output current to the filter and load;

activating the high-side switch of the second micro-power-switching phase, including coupling the voltage source to the second micro-power-switching phase's single loop coil, re-energizing the magnetic material around the first micro-power-switching phase's single coil element, and providing, via the second micro-power-switching phase's single coil element, output current to the filter and load; and activating the low-side switch of the second micro-power-switching phase, including coupling the second micro-power-switching phase's single loop coil to the ground voltage and providing, via the first micro-power-switching phase's single loop coil and the energized magnetic material, output current to the filter and load.

3. The method of claim 1 wherein alternatively activating each switch further comprises:

activating each high side switch for a period of time according to:

$$\frac{D}{N}$$

where D represents a duty cycle and N represents the number of power switching phases; and activating each low-side switch for a period of time according to:

$$\frac{(1-D)}{N}.$$

4. The method of claim 1 wherein the number of micro-power-switching phases is inversely proportional to the duty cycle of activating the switches and thereby inversely proportional to the inductance of the directly coupled inductor.

5. The method of claim 1 wherein current ripple experienced by the filter and the load comprises:

$$\frac{1}{f*L_{OL}} * \left(1 - \frac{V_{OUT}}{V_{IN}}\right) * \frac{V_{OUT}}{N},$$

where f represents the frequency of alternatively activating each switch, $L_{OL}$ represents the open loop inductance of directly coupled inductor, N represents the number of micro-power-switching phases, $V_{IN}$ represents the voltage of the voltage source and $V_{OUT}$ represents the voltage experienced at the filter and load.

6. The method of claim 1 wherein each high-side switch and each low-side switch comprises a Field Effect Transistor implemented in silicon.

7. The method of claim 1 wherein the chip further comprises a plurality of DC-DC converters, each DC-DC converter comprising a subset of the chip's plurality of micro-power-switching phases and each subset is electrically and magnetically decoupled from other subsets.

8. A method of manufacturing a DC ('Direct Current')-DC converter on a chip, the method comprising providing a semiconductor die having a p-type side and an n-type side, the p-type side comprising a top side and the n-type side comprising a bottom side of the semiconductor die;

removing an interior portion of the semiconductor die from the interior of the semiconductor die, the removal creating a hole in the semiconductor die defined in shape by an exterior portion not removed from the semiconductor die;

flipping the interior portion of the semiconductor die so that the interior portion of the semiconductor die is oriented with the n-type side being the top side and the p-type side being the bottom side;

inserting the interior portion into the hole of the semiconductor die;

fabricating in the top side of the interior portion a plurality of cells, each cell comprising a high-side switch having a control input for activating the high-side switch;

fabricating in the top side of the exterior portion a plurality of cells, each cell comprising a low-side switch having a control input for activating the low-side switch;

sputtering a magnetic material on the top side of semiconductor die;

burrowing a tunnel into the magnetic material for each cell fabricated on the semiconductor die; and applying on the magnetic material and within the burrowed tunnels, conductive material thereby electrically coupling pairs of high-side and low-side switches to the conductive material through the magnetic material, with each pair forming a micro-power-switching phase, where the conductive material forms an output node of the phase, and the conductive material in the burrowed tunnels forms, in each phase, a torodial inductor with a single loop coil and, for the plurality of phases, a directly coupled inductor.

9. The method of claim 8, wherein the output node of each micro-power-switching phase is configured to be coupled to a filter and a load; each high-side switch is configured, when activated, to couple a voltage source to the phase's single loop coil; the low-side switch of each phase is configured, when activated, to couple the phase's single loop coil to a ground voltage; and the DC-DC converter is configured to be operated by alternatively activating each switch, wherein no two switches of any phase are activated at the same time.

\* \* \* \* \*